United States Patent [19]

Hosoki et al.

[11] 4,438,371
[45] Mar. 20, 1984

[54] SOURCE OF CHARGED PARTICLES BEAM

[75] Inventors: Shigeyuki Hosoki, Hachioji; Masaaki Futamoto, Tsukui; Ushio Kawabe, Nishitama; Tohru Ishitani, Sayama; Hifumi Tamura, Hachioji, all of Japan

[73] Assignee: Hitachi, Ltd., Tokyo, Japan

[21] Appl. No.: 377,417

[22] Filed: May 12, 1982

[30] Foreign Application Priority Data

May 22, 1981 [JP] Japan ................................. 56-76502

[51] Int. Cl.³ ............................................. H01J 7/24
[52] U.S. Cl. ........................... 315/111.81; 250/423 F; 313/336; 315/341; 315/111.01
[58] Field of Search .................. 315/111.81; 250/281, 250/311, 423, 426, 423 F; 313/336

[56] References Cited

U.S. PATENT DOCUMENTS 3,315,125  4/1967  Frolich .......................... 315/111.81
3,405,263  10/1968  Wanlass et al. ................. 250/423 F
4,193,013  3/1980  Futamoto et al. .................. 313/336

Primary Examiner—Harold Dixon
Attorney, Agent, or Firm—Antonelli, Terry & Wands

[57] ABSTRACT

A source of charged particles beam which can be used either as an electron source or an ion source and has a tip formed of carbide, nitride or di-boride of at least one of elements Ti, Zr, Hf, V, Nb and Ta or formed of hexa-boride of at least one of rare earth metal elements of atomic number 57 to 70.

12 Claims, 2 Drawing Figures

SOURCE OF CHARGED PARTICLES BEAM

BACKGROUND OF THE INVENTION

The present invention relates to a source of charged particles and more particularly to a charged particles source in which when a needle-shaped tip is applied with a negative potential relative to the electrode facing the tip, it functions as a field emission cathode (electron source) and when applied with a positive potential functions as a field ionization ion source.

The field emission cathode (electron source) and the field ionization ion source have been used in totally different equipment although they have the same shape of tip. This is because the polarity of the charged particles generated by the electron source is opposite to that of the ion source and the current characteristics of the two sources are different. In the micro-fabrication in the range of micron and sub-micron, it is desirable that the features of electron beam and ion beam are both applied to lithography and fabrication and that the ion beam lithography and the micro-doping by ion implantation be performed in the vacuum using electron beams while enabling the operator to watch the whole process. To meet these requirements the best solution is to employ the tip that can be used both as an electron source and an ion source.

The tip material that has widely been used as the electron as well as ion source is a tungsten (W). This material, however, has problems. That is, when the tungsten tip is used as an ion source, the chemical reaction between the tip surface and the hydrogen gas makes it impossible to use it for a long period of time. When on the other hand the tungsten tip is used as an electron source, the emitted electrons ionize the residual gas molecules in the vacuum space and these ions are accelerated, as opposed to the electrons, to bombard the tip thereby increasing instability of field emission current. Thus, the material used as electron source must have a sufficient strength to undergo bombardment of ions. The tungsten, however, cannot be said to meet this requirement.

SUMMARY OF THE INVENTION

The object of this invention is to provide a charged particles source which can be operated either as an electron source or an ion source.

To achieve the above object the charged particles source of this invention has a tip which is formed of carbide or nitride or diboride of at least one of elements Ti, Zr, Hf, V, Nb and Ta, or hexa-boride of at least one of rare earth metal elements of atomic number 57 to 70.

DETAILED DESCRIPTION OF PREFERRED EMBODIMENTS

The tip material used in this invention is selected from any one of such materials as TiC, ZrC, HfC, VC, NbC or TaC, or the compounds of these such as TiN, ZrN, HfN, VN, NbN or TaN, or their compounds $TiB_2$, $ZrB_2$, $HfB_2$, $VB_2$, $NbB_2$, $TaB_2$, or their compounds $LaB_6$, $CeB_6$, $PrB_6$, $NdB_6$, $SmB_6$ or $EuB_6$. While the carbides and nitrides listed above have the metal element-to-C or N ratio of 1:1, it is also possible to use as the tip material such compounds as $TiC_{0.8}$ or $ZrC_{0.9}$ having non-chemical rate. It is, however, preferable to use the materials that have a chemically stable ratio of 1:1. Since these materials are extremely hard, it is also preferable to use a single crystal whisker for the tip from the viewpoint of manufacture.

It is known that a part of these materials is used as an electron emission cathode. What has led to this invention is the discovery that these materials can be used both as a stable electron source and an ion source; that the reaction of these material with hydrogen gas is much smaller than tungsten when they are used as an ion source; and that when they are used as an electron source current stability is improved for their small ion sputtering rate.

The present invention will be explained referring to the accompanying drawings.

Figure 1:
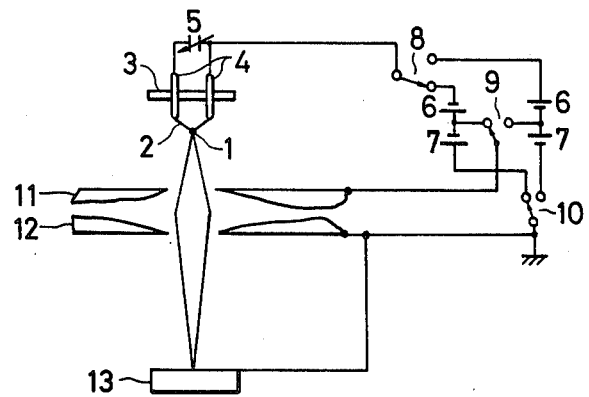
FIG. 1 is a schematic diagram showing the principle of this invention.

FIG. 1 illustrates the simplified principle of this invention. A tip 1 is placed in contact with a filament 2 which acts as a supporter, a heater and a heat-conductor. The filament 2 is in turn bonded to a stem 4 secured to an insulator base 3. Though not shown in FIG. 1, the heat-conductor is connected to a cooling stage of small freezer. In this way the temperature of the tip 1 can be varied from several K to 2000 K. A voltage source 6 or 6' is connected between the tip 1 and a first electrode 11 to produce an electric field around the tip and the charged particles thus generated are drawn out and attracted by the first electrode 11. A second voltage source 7 or 7' is connected between the first electrode 11 and a second electrode 12 to accelerate the charged particles drawn out by the first electrode and converge them onto a specimen or work piece 13. The first electrode 11 and the second electrode 12 constitute an electrostatic lens. The switches 8, 9 and 10 are used to select sources. When the electric sources 6 and 7 are used electron beams are produced. When the sources 6' and 7' are used ion beams are produced. A source 5 is for heating the filament 2.

There are two major problems encountered in embodying the present invention. The structure of the beam source may be the same for both the field emission (electron source) and the field ionization (ion source). It is, however, desirable that the vacuum pressure for the field emission be lower than $10^{-9}$ Torr while on the other hand the field ionization requires the vacuum pressure of approximately $10^{-4}$ Torr though it may vary slightly depending on the gas used. This difference of vacuum pressure causes a great problem which it is desired to use the same tip as an electron source or an ion source by swiftly changing over the switches.

Secondly, in electron optical systems an electromagnetic lens with small aberration is used to minimize the aberration while in ion optical systems an electrostatic lens is used because the effect of lens under conventional magnetic field is too small due to the mass of ions. Thus, the selection of either lens system will not provide characteristics which is optimum for both the electrons and ions.

The embodiment of this invention to be described in the following overcomes the above drawbacks and enables the generation of both the electrons and ions with a single device.

Figure 2:
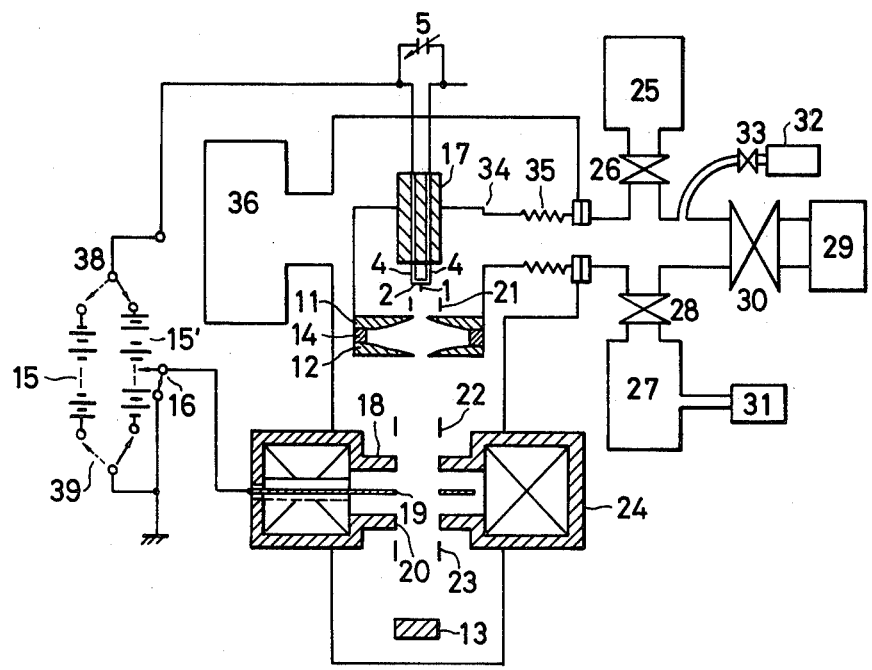
FIG. 2 is a schematic diagram of one embodiment of this invention.

FIG. 2 shows one embodiment of this invention. A charged particle generating chamber 34 is placed in the vacuum in the instrument column and has aperture holes of the first and second electrodes 11, 12. The volume of the charged particles generating chamber 34 is about 200 ml. For the field emission an evacuating pump 25 such as ion pump is used to achieve an ultra-high vacuum as obtained with conventional devices. For the field ionization a gas is introduced to obtain desired pressure. When the vacuum pressure in the instrument column is $10^{-7}$ to $10^{-3}$ Torr, the aperture holes of the first and second electrodes 11, 12 are made sufficiently small so that an increase in pressure in the instrument column can be kept small, that is, the pressure in the instrument column will be on the order of $10^{-6}$ to $10^{-7}$ Torr. Gas is introduced from the gas reservoir 32 by opening the valve 33. Gas evacuation is done by an oil diffusion pump 27 having high evacuating rate by opening its valve 28 and closing the valve 26 of the ion pump 25. However, since the volume of the charged particles generating chamber is small, the diffusion pump does not require a large evacuating power as was required with conventional devices and therefore a single diffusion pump that can achieve ultra-high vacuum may be used to perform functions of the two pumps 25 and 27. In this way because of the small volume of the chamber 34 the switching from the ion source to the electron source can easily be effected.

The focusing lens system for electrons or ions can be achieved by the first and second electrodes 11, 12. The diameter of the focused beam is about 0.1 μm for electron and about 0.3 μm for ion. To obtain smaller diameter beams a lower focusing lens (objective lens) 24 is used. The electrodes 18 and 20 of the focusing lens 24 constitute poles and pieces as a magnetic lens serving also as a magnetic york. Added with a non-magnetic electrode 19, these three electrodes 18, 19, 20 form an electrostatic lens or what is generally called an einzel lens. The electrodes 18, 20 have the same potential of the instrument column. When using ion beams, switches 38, 39, 16 are changed over to the power source 15' to produce a retarding potential at the electrode 19 which focuses the ion beams on the surface of work piece 13. For focusing electrons this lens 24 is used as magnetic lens. With the above arrangement it is possible to improve the focusing power for both the electrons and ions.

Though now shown in FIG. 2, this embodiment also has a first electric source 6, 6', a second electric source 7, 7' and switches 8, 9, 10 as shown in FIG. 1. With these it is possible to apply voltage between the tip 1 and the first electrode 11 and between the first electrode 11 and the second electrode 12. But this voltage application can be made simpler, that is, instead of providing separate sources 6, 6', 7, 7', a source 15 is used in place of sources 6' and 7' and source 15 in place of sources 6 and 7, and a switch 9 is inserted between two sources 15, 15'. Then the switch 38 performs the function of the switch 8, and the switch 39 the function of the switch 10. The position of the switch 16 is between the electrode 11 and the ground.

In FIG. 2, reference numeral 14 denotes an insulating supporter disposed between the first and second electrodes 11, 12; 17 an insulating supporter formed of ceramics such as alumina; 21 an aligner electrodes for correcting the electron or ion optical axis deviation that may occur when the electron/ion switchover is effected due to the machining or construction accuracy error; 22 blanking electrodes for controlling the beam exposition; 23 deflection electrodes for deflecting and scanning beams; 29 a primarily evacuating pump such as sorption pump or rotary pump; 30 a switchover valve; 31 a rotary pump for backward evacuating used when the pump 27 is a diffusion pump; 36 an evacuating pump such as ion pump; and 35 a bellows for facilitating fine mechanical adjustment of the charged particles generating chamber 34 in the vacuum of the instrument column.

While the structure of the cooling means for tip 1 is not shown, it can be added to the embodiment of FIG. 2 as in the conventional devices.

The charged particles source of this invention serving both as an electron source and an ion source can not only be used in electron beam instruments, scanning electron microscopes, electron beam fabricating instruments and electron probe micro-analysers but also in ion probe micro-analysers, ion beam lithography-fabrication instruments and ion beam micro-doping instruments using fine ion beams. Thus, with the charged particles source of this invention, it is possible to achieve a device employing both electron beams and ion beams.

What is claimed is:

1. A source of charged particles comprising: a charged particles generating chamber; a tip disposed inside the charged particles generating chamber, the tip material being carbides, nitrides or di-borides of at least one of elements Ti, Zr, Hf, V, Nb and Ta or hexaborides of at least one of rare earth metal elements of atomic number 57 to 70; a supporter for supporting the tip; a source for supplying material to be ionized; a first electrode for producing a field near the tip to draw out the charged particles generated; a second electrode for accelerating and converging the charged electrodes drawn out by the first electrode; a first electric source connected between the tip and the first electrode; a second electric source connected between the first and second electrodes; and a switching means for changing virtually simultaneously a relative polarity between the tip and the first electrode and between the first and second electrodes so as to make the field positive or negative to accelerate and converge the charged particles as desired.

2. A source of charged particles as set forth in claim 1, wherein the tip is formed of a single crystal of carbide of at least one of elements Ti, Zr, Hf, V, Nb and Ta.

3. A source of charged particles as set forth in claim 2, wherein the single crystal is a single crystal whisker.

4. A source of charged particles as set forth in claim 1, wherein the tip is a single crystal of nitride of at least one of elements Ti, Zr, Hf, V, Nb and Ta.

5. A source of charged particles as set forth in claim 4, wherein the single crystal is a single crystal whisker.

6. A source of charged particles as set forth in claim 1, wherein the tip is a single crystal of di-boride of at least one of elements T, Zr, Hf, V, Nb and Ta.

7. A source of charged particles as set forth in claim 6, wherein the single crystal is a single crystal whisker.

8. A source of charged particles as set forth in claim 1, wherein the tip is a single crystal of hexa-boride of at least one of rare earth metal elements of atomic number 57 to 70.

9. A source of charged particles as set forth in any preceding claim 1 through 8, wherein the supporter is a filament which serves as a heater and a heat-conductor and, to heat or cool the supporter the electric source and a freezer are connected to the supporter.

10. A source of charged particles as set forth in any claim 1 through 8, wherein an electrostatic lens is provided to further converge charged particles drawn out from the second electrode.

11. A source of charged particles as set forth in any claim 1 through 8, wherein the tip is applied with a negative potential relative to the first electrode and the charged particles are electrons.

12. A source of charged particles as set forth in any claim 1 through 8, wherein the tip is applied with a positive potential relative to the first electrode and the charged particles are ions.

* * * * *